United States Patent [19]

Goma

[11] Patent Number: 5,576,667
[45] Date of Patent: Nov. 19, 1996

[54] VOLTAGE CONTROL TYPE OSCILLATOR

[75] Inventor: Shinji Goma, Komatsu, Japan

[73] Assignee: Murata Manufacturing Co., Ltd., Nagaokakyo, Japan

[21] Appl. No.: 561,317

[22] Filed: Nov. 21, 1995

[30] Foreign Application Priority Data

Nov. 22, 1994 [JP] Japan .................................. 6-287830

[51] Int. Cl.$^6$ ........................................ H03B 5/18
[52] U.S. Cl. ...................... 331/117 D; 331/74; 331/77; 331/96; 331/117 R; 331/177 V
[58] Field of Search ..................................... 331/36 C, 74, 331/77, 96, 99, 101, 107 DD, 107 SL, 116 R, 116 FE, 117 R, 11 FE, 117 D, 177 V

[56] References Cited

U.S. PATENT DOCUMENTS

| | | | |
|---|---|---|---|
| 2,817,761 | 12/1957 | Hollmann | 331/117 D |
| 3,596,203 | 7/1971 | Sakamoto et al. | 331/96 |
| 4,990,865 | 2/1991 | Martheli | 331/99 |
| 5,140,286 | 8/1992 | Black et al. | 331/99 |
| 5,164,686 | 11/1992 | Shiga | 331/99 |
| 5,185,583 | 2/1993 | Ooi et al. | 331/15 |
| 5,373,264 | 12/1994 | Higgins, Jr. | 331/117 R |
| 5,446,419 | 8/1995 | Miya et al. | 331/99 |
| 5,512,862 | 4/1996 | Avanic et al. | 331/117 D |

Primary Examiner—David Mis
Attorney, Agent, or Firm—Burns, Doane, Swecker & Mathis, LLP

[57] ABSTRACT

An inexpensive voltage control type oscillator suitable for use with a mobile radio communication system within a predetermined frequency band range. The oscillator includes a resonance circuit and an oscillation stage formed on a printed wiring board and operating such that the oscillation frequency of the oscillation stage is varied within a predetermined frequency band range by varying the resonance frequency of a parallel resonance circuit included in the oscillation stage on the basis of a control voltage. The parallel circuit comprises a strip line connected in series with a bias resistor and a chip capacitor connected parallel to the strip line. The strip line has an inductance sufficiently larger than that of the resistor and the chip capacitor has a capacitance value so determined that the capacitor resonates at a predetermined frequency in cooperation with the strip line.

17 Claims, 2 Drawing Sheets

■ POINT OF ADJUSTMENT BY A PARALLEL RESONANCE CIRCUIT 21

● CHIP INDUCTOR

VOLTAGE CONTROL TYPE OSCILLATOR

BACKGROUND OF THE INVENTION

1. Field of the Invention

The present invention relates to a voltage control type oscillator suited for a mobile radio communication system within a frequency band width of hundreds of MHz to several GHz and, more particularly, to a voltage control type oscillator constructed such that a plurality of parts are mounted on a printed wiring board to form a resonance circuit wherein an oscillation stage and the oscillation frequency of the oscillation stage is varied within a predetermined frequency band range by varying the resonance frequency of a parallel resonance circuit for the resonance circuit on the basis of an inputted control voltage.

2. Background

Referring to FIG. 3, which is a circuit diagram showing the structure of a conventional voltage control type oscillator, the voltage control type oscillator is used with a mobile radio communication system of, for example, a frequency band of 900 MHz. It generally comprises a control terminal C, an output terminal P, a resonance circuit 1 whose resonance frequency varies depending on a control voltage Vc to be impressed upon the control terminal C, an oscillation stage 12 whose oscillation frequency is determined by the resonance frequency of the resonance circuit 1, a buffer stage 3 which amplifies the signal outputted from the oscillator stage 12 and which prevents the variation of the oscillation frequency of the oscillation stage 12 by the load variation and an output matching stage 4 which matches a next stage circuit to be connected to the output terminal P and inhibits higher harmonics. All portions of the voltage control type oscillator shown in FIG. 3 are formed by mounting a plurality of parts (to be described later) on a printed wiring board made of alumina or the like.

The resonance circuit 1 comprises a coupling capacitor C1, a variable capacitance diode VD, a resonance inductor L1 and a resonance capacitor C2. The control voltage Vc impressed upon the control terminal C is applied to the variable capacitance diode VD through a choke coil L2. The control terminal C is grounded in a high frequency mode by means of a high frequency bypass capacitor C3.

The Colpitts oscillation stage 12 comprises an oscillation transistor Q1 as an active element, bias resistors R1–R3, capacitors C4 and C5, a high frequency bypass capacitor C6 and a chip inductor LL to be connected in series between a voltage supply VB and the bias resistor R3. The oscillation stage 12 is connected to the resonance circuit 1 through a coupling capacitor C7. Further, the bias resistor R3 regulates the DC bias of an emitter as a current outputting terminal of the oscillation transistor Q1. The chip inductor LL has an inductance (for example, several tens of nH—several μH) giving rises to an impedance sufficiently higher than that of the bias resistor R3 within a frequency band of 900 MHz.

The Q (the Quality of the reactive circuit, given by the ratio of the reactance to the total resistance of the circuit) of the resonance circuit 1 is most influenced by the impedance of the emitter of the oscillation transistor Q1, which becomes a load on the resonance circuit 1. The higher the impedance of the emitter, the smaller the deterioration of the Q of the resonance circuit 1. At a high frequency, the impedance of the chip inductor LL becomes high so that the impedance of the emitter of the oscillation transistor Q1 becomes high. Accordingly, the load on the resonance circuit 1 becomes large and the deterioration in Q of the resonance circuit 1 is small so that the C/N (Carrier to Noise Ratio) characteristic of the voltage control type oscillator is improved.

The oscillation stage 12 is connected to the buffer stage 3 through a coupling capacitor C8, at a node between two series connected bias resistors R4 and R5, as well as to the gate of buffer transistor Q2. The bias resistors are series connected between the driving power supply terminal B and ground. The emitter of the buffer transistor Q2 is also connected to ground.

The output matching stage 4 comprises a choke coil L3, a coupling capacitor C10, a high frequency bypass capacitor C11 and an output terminal P. A driving power supply terminal B, to which a driving power supply VB for the oscillation transistor Q1 and the buffer transistor Q2 is applied, is grounded in a high frequency mode by means of a high frequency bypass capacitor C12.

By changing the capacitance value of the variable capacitance diode VD in the resonance circuit 1 in proportion to the value of the control voltage Vc, the resonance frequency of the resonance circuit 1 changes, the oscillation stage 12 oscillates at the changed resonance frequency and an output signal is generated from the output terminal P.

Now, in order to improve the C/N characteristic of the voltage control type oscillator, it is ideal that the impedance of the current output terminal of the active element becomes infinite at an oscillation frequency within a predetermined frequency band. For realizing such an ideal state, it is necessary to bring the impedance of the chip inductor LL into an open state within the predetermined frequency band.

However, as shown in FIG. 4, the chip inductor LL can be expressed as an equivalent circuit with respect to a parallel resonance circuit comprising an inductance L, a resistor R and a capacitor C at a high frequency. Further, in the chip inductor LL, the value of the inductance L, and the values of the resistor R and the capacitance C are determined together and if the value of the inductance L is determined, the values of the resistor R and the capacitance C will be automatically determined, making it impossible to change only the value of the capacitance C. Therefore, in the chip inductor LL, there have been many cases in which the resonance frequency of the parallel resonance circuit greatly deviates from the predetermined frequency band so that the impedance at a frequency using the predetermined frequency band becomes relatively small to deviate from its open state. Accordingly, the conventional voltage control type oscillator has had a first problem that even when the chip inductor LL is used, the degree of improvement of the C/N characteristic of the oscillator is small.

Further, the conventional voltage control type oscillator has had a second problem that since it uses a comparatively expensive chip inductor LL, the overall cost of the oscillator becomes high.

In order to solve the above-described first problem, it is considered that the chip inductor LL is connected in parallel to the chip capacitor and the resonance frequency by the connection of the chip inductor LL and the chip capacitor is caused to coincide with a predetermined frequency band. In this case, however, the number of parts increases so that there arises another problem that the voltage control type oscillator becomes large in size.

SUMMARY OF THE INVENTION

Accordingly, it is an object of the present invention to solve the above-described technical problems and to provide a voltage control type oscillator with improved C/N characteristic and which is inexpensive.

According to the present invention, there is provided a voltage control type oscillator which comprises a resonance circuit and an oscillation stage which are formed by mounting a plurality of parts on a printed wiring board and operates such that the resonance frequency of a parallel resonance circuit of the resonant circuit is varied on the basis of a control voltage input to the circuit so that the oscillation frequency of the oscillation stage is varied within a predetermined frequency band range. Further, the oscillation stage of the voltage control type oscillator comprises an active element being adapted to compensate for a power loss in the parallel resonance circuit, a bias resistor for regulating the DC bias of a current output terminal of the active element, a strip line comprising a substrate and a printed wiring and connected in series with the bias resistor with the strip line having an inductance larger than that of the bias resistor within a predetermined frequency band, and a chip capacitor connected parallel to the strip line and having a capacitance value so determined that it resonates at a predetermined frequency in cooperation with the strip line.

Further, according to the present invention, the strip line of the oscillation stage is connected in series with the bias resistor and is formed by a board and a printed wiring. It has an impedance higher than that of the bias resistor. The chip capacitor is connected in parallel to the strip line with its capacitance value being so determined that the chip capacitor resonates at a predetermined frequency in cooperation with the strip line. Consequently, as in the case of the chip inductor, a parallel resonance circuit comprising the strip line and the chip capacitor is formed.

This parallel resonance circuit has the advantage that the inductance and the capacitance of this circuit can be varied separately and by adjusting the length of the strip line and the capacitance of the chip capacitor, it is possible to cause the resonance frequency of the strip line and the chip capacitor to coincide with a predetermined frequency with ease, thereby maximizing the impedance at the predetermined frequency. Accordingly, it is possible to cause the impedance of the strip line and the chip capacitor to come close to its open state and to improve the C/N characteristic of the voltage control type oscillator. Further, since the strip line is formed by the board and the printed wiring, the cost of the strip line can be reduced to zero and the cost of the chip capacitor can be reduced to less than one-tenth of that of the chip inductor. Consequently, the voltage control type oscillator can be constructed at low cost.

PREFERRED EMBODIMENT OF THE INVENTION

A preferred embodiment of the present invention will now be described with reference to the accompanying drawings.

Figure 1:
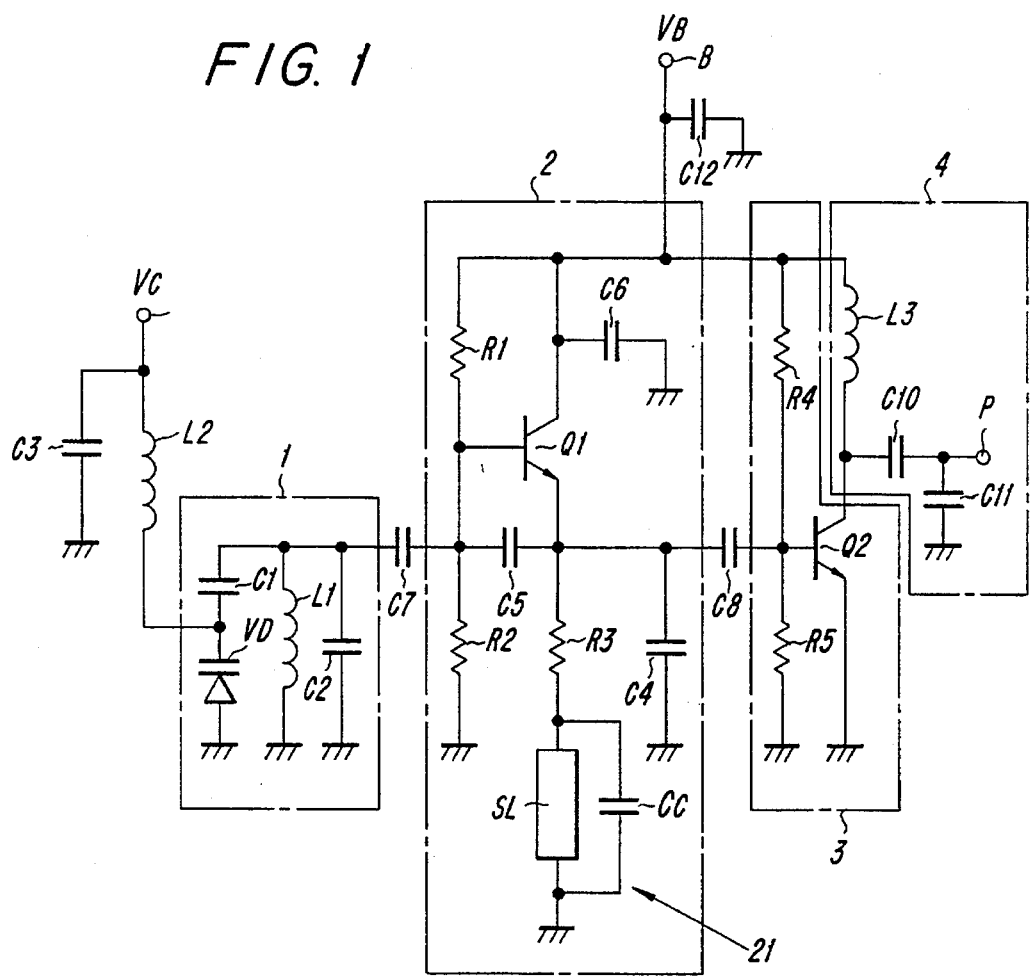
FIG. 1 is a circuit diagram showing the structure of a voltage control type oscillator according to one embodiment of the present invention.
Figure 3:
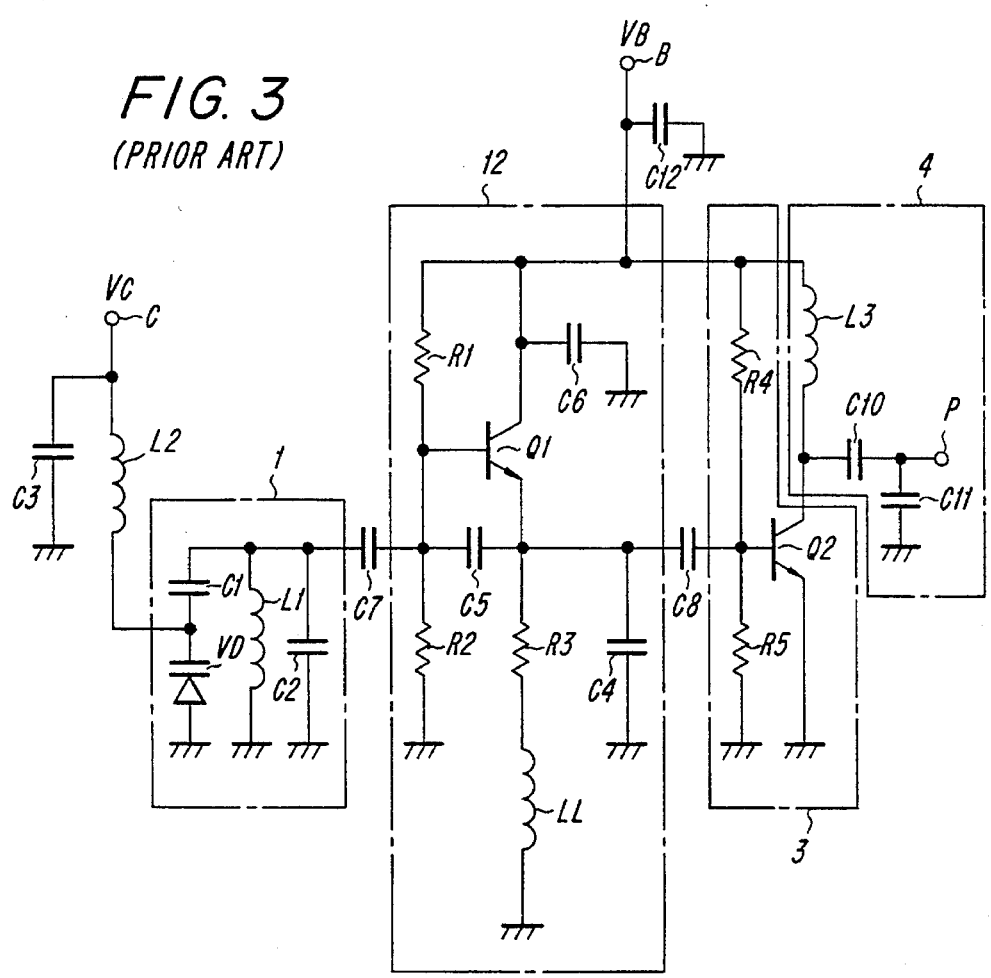
FIG. 3 is a circuit diagram showing the structure of a conventional voltage control type oscillator.

FIG. 1 is a circuit diagram showing the structure of a voltage control type oscillator according to the present invention while FIG. 3 is a circuit diagram showing the structure of a conventional voltage control type oscillator. In these figures, like parts are designated by like reference numerals.

In FIG. 1, the voltage control type oscillator is used with a mobile radio communication system within, for example, a 900 MHz band range. It generally comprises a control terminal C, an output terminal P, a resonance circuit 1 whose resonance frequency varies by a control voltage Vc to be impressed upon the control terminal C, an oscillation stage 2 whose oscillation frequency is determined by the resonance frequency of the resonance circuit 1, a buffer stage 3 which amplifies the signal outputted from the oscillation stage 2 and prevents the variation of the oscillation frequency of the oscillation stage 2 by the load variation and an output matching stage 4 for matching a next stage circuit to be connected to the output terminal P and inhibits high harmonics. All portions of the voltage control type oscillator are formed by mounting a plurality of parts to be described later on a printed wiring board (not shown) which is made of alumina or the like a plurality of parts to be described later.

In the instant embodiment, the resonance circuit 1, the buffer stage 3 and the output matching stage 4 are constructed in the same way as those of the conventional voltage control type oscillator as shown in FIG. 3 so that the description thereof is omitted herein. Further, these elements may be replaced with other circuit elements if the replacements have the same functions as those of they are replacing and the buffer stage 3 and the output matching stage 4 may be omitted.

The Colpitts oscillation stage 2 of the instant embodiment comprises an oscillation transistor Q1 as an active element, bias resistors R1–R3, capacitors C4 and C5, a high frequency by-pass capacitor C6, a strip line SL to be connected in series with the bias resistor R3, and a chip capacitor Cc to be connected parallel to the strip line SL. The oscillation stage 2 is connected to the oscillation circuit 1 through a coupling capacitor C7. Further, the bias resistor R3 regulates the DC bias of the emitter as the current output terminal of the oscillation transistor Q1.

Figure 4:
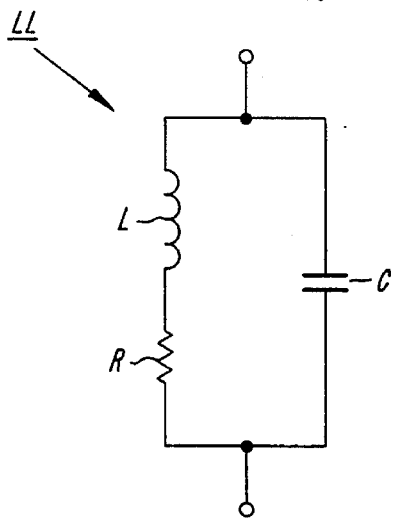
FIG. 4 is a high frequency equivalent circuit for the chip inductor shown in FIG. 3.

The strip line SL and the chip capacitor Cc, like a chip inductor LL in FIG. 3, form a parallel resonance circuit 21 which is represented by an equivalent circuit shown in FIG. 4. It should be noted that although in the instant embodiment the parallel resonance circuit 21 is interposed between the bias resistor R3 and ground, the bias resistor R3 may be replaced with the parallel resonance circuit 21 such that the parallel resonance circuit 21 may be interposed between the emitter as the current output terminal of the oscillation transistor Q1 and the bias resistor R3.

The strip line SL is formed on a board as a printed wiring and has an inductance (e.g., 66 nH) sufficiently larger than that of the bias resistor R3 in a 900 MHz band range. By the way, the strip line SL may be made in any form such as zigzag or linear. Further, the parallel resonance circuit 21 is formed such that the length of the strip line SL (e.g., 15 mm) and the capacitance value of the chip capacitor Cc (e.g., 3 pF) are determined in advance by using a network analyzer so that it is held open in an AC mode within a 900 MHz band range. Therefore, the parallel resonance circuit resonates in the 900 MHz band range.

As a result of measurements by an experiment of the C/N characteristic of the voltage control type oscillator of the present invention, where the parallel resonance circuit 21 comprising the strip line SL and the chip capacitor Cc is used with a detuning frequency of 25 KHz and a frequency band of 1 KHz, a measured value of 85 dBc was obtained. Further, a similar measurement of the C/N characteristic of the same oscillator when, however, the parallel resonance circuit 21 was removed from the oscillator was conducted with the other conditions unchanged. As a result, a measured value of 82 dBc was obtained. Accordingly, these results show that, by the provision of the parallel resonance circuit 21, the C/N characteristic of the oscillator can be improved by 3 dBc in comparison to an oscillator having no such parallel resonance circuit.

Figure 2:
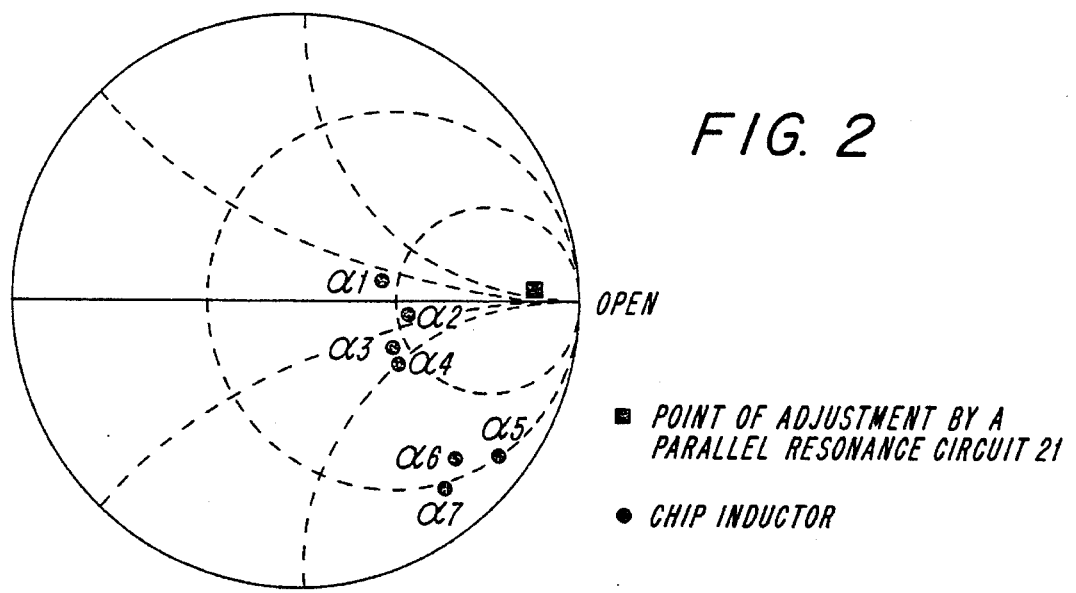
FIG. 2 is a Smith chart showing comparison between the characteristics of a parallel resonance circuit 21 shown in FIG. 1 and a chip inductor LL shown in FIG. 3.

On the other hand, when an experiment was conducted on the C/N characteristic of a voltage control type oscillator using a chip conductor LL (having an inductance value of 100 nH–10 µH) instead of the parallel resonance circuit 21, it was found that the C/N characteristic of the oscillator was 84 dBc at the maximum, showing an improvement over the conventional oscillator by 2 dBc at best. The chip inductor LL used in the above experiment was of a small-sized inexpensive lamination type (having an inductance value of 47 nH–5.6 µH). The following table lists the values associated with $\alpha 1$–$\alpha 7$ in the Smith chart of FIG. 2.

|  | L (Inductance) | R($\Omega$) (Resistance) | X($\Omega$) (Reactance) |
| --- | --- | --- | --- |
| $\alpha 1$ | 47 nH | 72.5 | 3.6 |
| $\alpha 2$ | 68 nH | 75.1 | −5.8 |
| $\alpha 3$ | 82 nH | 60.4 | −9.1 |
| $\alpha 4$ | 100 nH | 58.0 | −10.5 |
| $\alpha 5$ | 680 nH | 25.6 | −95.6 |
| $\alpha 6$ | 1.0 µH | 23.8 | −74.4 |
| $\alpha 7$ | 5.6 µH | 20.4 | −70.2 |
| ■ |  | 405.6 | 512.8 |

The Q value thereof is as low as about 20 failing to reach its opening point in the 900 MHz band so that it shows only a small degree of improvement in the C/N characteristic of the oscillator. Therefore, in order to improve the C/N characteristic by 2 dBc, an expensive large-sized inductor (having a large Q value) must be used.

Accordingly, by using the parallel resonance circuit 21 comprising a combination of the strip line SL and the chip capacitor Cc instead of using the chip inductor LL, it is easy to cause the impedance of the circuit to come close to its open point and to increase the degree of improving the C/N characteristic of the circuit. Further, while the conventional voltage control type oscillator uses a single expensive chip inductor LL, the oscillator of the present invention uses only a single inexpensive chip capacitor Cc so that the manufacturing cost of the oscillator can be reduced. Moreover, since the parallel resonance circuit 21 of the present invention is formed of the strip line SL and the chip capacitor Cc, the length of the strip line SL and the capacitance of the chip capacitor Cc can be adjusted so that the C/N characteristic of the oscillator can be improved to the maximum degree within various frequency bands to thereby increase its design flexibility. This adjustment can be done in a simple manner by adjusting the length of the strip line to equal the length in which the strip line does not self-resonate in the frequency less than the oscillation frequency of the voltage control oscillator since the C/N characteristics can be most improved when the resonance frequency of the parallel resonance circuit (including the strip line SL and the chip capacitor Cc) is the same as the oscillation frequency of the voltage control oscillator.

At a high frequency where gain is at a peak, since the strip line SL has a floating capacitance, the strip line SL self-resonates at a certain frequency. This occurs in a lower frequency if the strip line SL is longer and thinner. In the case of a higher frequency, the resonance frequency can be adjusted to the oscillation frequency of the voltage control oscillator by adding the capacitor Cc in parallel so as to lower the self-resonance point. However, at a lower frequency where gain is at another peak, the resonance frequency cannot be adjusted except by changing the strip line SL. Therefore, the strip line SL having the characteristics at a higher frequency where gain is at a peak is generally formed. The length and the width of the strip line SL can be determined using a computer simulation or the like. Similarly, the capacitance of the chip capacitor Cc can be selected by computer simulation or by finding the point in which the C/N characteristic of the voltage control oscillator is most improved. Further, it is possible to commonly use the printed wiring board within various frequency bands.

It should be noted that although in the instant embodiment, the strip line SL has been described to have a length of 15 mm and an inductance of 66 nH and the chip capacitor Cc has been described to have a capacitance of 3 pH, the length and inductance of the strip line may have different values and the capacitance of the chip capacitor Cc may be determined on the bases of such different values of the strip line SL.

Further, in the instant embodiment, the oscillation transistor Q1 is used as an active element but a FET may be used in its stead and, in that case, the source of such FET becomes a current output terminal.

Having thus described the present invention by way of its preferred embodiment, it will now be understood that the voltage control type oscillator according to the invention has the following various advantages. The inductance of the strip line and the capacitance of the chip capacitor can be changed individually and by adjusting the length of the strip line and the capacitance of the chip capacitor. Further, the resonance frequency of the strip line and the chip capacitor can be made to coincide with a predetermined frequency with ease. Also, the impedance at the predetermined frequency can be made maximum so that it is possible to cause the impedance of the strip line and the chip capacitor to come close to its open state thereby further improving the C/N characteristic of the voltage control type oscillator. Further, since the strip line is formed of a board and a printed wiring, the cost of the strip line can be reduced to zero and the cost of the chip capacitor can be reduced to one-tenth (1/10) of that of the chip inductor so that it is possible to construct the voltage control type oscillator at low cost.

It will be appreciated by those of ordinary skill in the art that the present invention can be embodied in other specific forms without departing from the scope thereof. The presently disclosed embodiments are therefore considered in all respects to be illustrative and not restrictive. The scope of the invention is indicated by the appended claims rather than the foregoing description and all changes which come within the meaning and range of equivalents thereof are intended to be embraced therein.

What is claimed is:

1. A voltage control type oscillator comprising:

a resonance circuit including a parallel resonance circuit; and an oscillation stage wherein an oscillation frequency of said oscillation stage varies within a predetermined frequency band by varying a resonance frequency of the parallel resonance circuit of said resonance circuit on the basis of an inputted control voltage, said oscillation stage including:

an active element having a current output terminal and adapted to compensate for a power loss in said parallel resonance circuit;

a bias resistor for regulating the DC bias of the current output terminal of said active element;

a strip line connected in series with said bias resistor, said strip line having an inductance larger than that of said bias resistor within a predetermined frequency band; and a chip capacitor which is connected in parallel to said strip line and whose capacitance value is determined so that said chip capacitor resonates at a predetermined frequency in cooperation with said strip line.

2. A voltage control type oscillator according to claim 1, wherein said oscillation stage is formed on a printed wiring board having wirings and said strip line is one of said wirings.

3. A voltage control type oscillator according to claim 1, wherein said strip line has an inductance of approximately 66 nH in a 900 MHz band.

4. A voltage control type oscillator according to claim 1, wherein said strip line and said chip capacitor are interposed between the bias resistor and ground.

5. A voltage control type oscillator according to claim 1, wherein said strip line and said chip capacitor are interposed between said active element and the bias resistor.

6. A voltage control type oscillator according to claim 1, wherein said active element is a transistor.

7. A voltage control type oscillator according to claim 1, wherein said strip line has the shape of one of a zigzag, a straight line and combination thereof.

8. A voltage control type oscillator according to claim 1, wherein said strip line has a length of 15 mm and an inductance of 66 nH and said chip capacitor has a capacitance value of 3 pF.

9. A voltage control type oscillator according to claim 1, wherein said strip line and said chip capacitor form a parallel resonance circuit, a length of the strip line and a capacitance value of the chip capacitor are determined so that said parallel resonance circuit is held open in an AC mode within said predetermined band range.

10. A voltage control type oscillator according to claim 1, wherein said predetermined band range is in the 900 MHz frequency band.

11. A voltage control type oscillator according to claim 1, wherein a resonance frequency of said resonance circuit varies depending on a control voltage to be impressed upon the control terminal thereof.

12. A voltage control type oscillator according to claim 1, wherein said oscillation stage is a Colpitts oscillator.

13. A voltage control type oscillator according to claim 1, wherein said oscillation stage further comprises a high frequency bypass capacitor.

14. A voltage control type oscillator according to claim 1, wherein said oscillation stage is connected to the resonance circuit through a coupling capacitor.

15. A voltage control type oscillator according to claim 1, wherein said resonance circuit comprises a coupling capacitor, a variable capacitance diode, a resonance inductor and a resonance capacitor.

16. A voltage control type oscillator according to claim 1, further comprising a buffer stage which amplifies a signal outputted from the oscillator stage and which prevents the variation of the oscillation frequency of the oscillation stage by a load variation.

17. A voltage control type oscillator according to claim 1, further comprising an output matching stage which matches a next stage circuit to be connected to an output terminal thereof and inhibits higher harmonics.

* * * * *